United States Patent
Nanjundiah et al.

(10) Patent No.: US 10,164,137 B2
(45) Date of Patent: Dec. 25, 2018

(54) ELECTRONIC DEVICES COMPRISING TWO ENCAPSULANT FILMS

(71) Applicant: Dow Global Technologies LLC, Midland, MI (US)

(72) Inventors: Kumar Nanjundiah, Midland, MI (US); John A. Naumovitz, Midland, MI (US); Michael D. White, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 34 days.

(21) Appl. No.: 14/777,693

(22) PCT Filed: Apr. 16, 2014

(86) PCT No.: PCT/US2014/034335
§ 371 (c)(1),
(2) Date: Sep. 16, 2015

(87) PCT Pub. No.: WO2014/176088
PCT Pub. Date: Oct. 30, 2014

(65) Prior Publication Data
US 2016/0276512 A1    Sep. 22, 2016

Related U.S. Application Data

(60) Provisional application No. 61/814,547, filed on Apr. 22, 2013.

(51) Int. Cl.
| | |
|---|---|
| *H01L 31/00* | (2006.01) |
| *H01L 31/048* | (2014.01) |
| *H01L 31/049* | (2014.01) |
| *H01L 31/18* | (2006.01) |

(52) U.S. Cl.
CPC ........ *H01L 31/0488* (2013.01); *H01L 31/049* (2014.12); *H01L 31/0481* (2013.01); *H01L 31/18* (2013.01); *Y02E 10/50* (2013.01)

(58) Field of Classification Search
CPC .................... H01L 31/049; H01L 31/0481
See application file for complete search history.

(56) References Cited

U.S. PATENT DOCUMENTS

| | | | |
|---|---|---|---|
| 9,093,585 B2 | 7/2015 | Seo et al. | |
| 2006/0219294 A1* | 10/2006 | Yabuuchi | H01G 9/2031 136/263 |
| 2008/0023063 A1* | 1/2008 | Hayes | H01L 31/048 136/251 |
| 2008/0115825 A1* | 5/2008 | Patel | B32B 17/10018 136/252 |
| 2011/0290317 A1 | 12/2011 | Naumovitz et al. | |
| 2012/0111407 A1 | 5/2012 | Rummens et al. | |
| 2013/0056862 A1 | 3/2013 | Kim et al. | |
| 2013/0255756 A1 | 10/2013 | Seo et al. | |
| 2013/0269776 A1 | 10/2013 | Wu et al. | |
| 2013/0306149 A1* | 11/2013 | Maeda | H01L 31/048 136/259 |
| 2014/0096825 A1 | 4/2014 | Bonekamp et al. | |

FOREIGN PATENT DOCUMENTS

| | | | | |
|---|---|---|---|---|
| JP | WO 2012105331 A1 * | 8/2012 | | H01L 31/048 |
| JP | 2013-118302 A | 6/2013 | | |
| WO | 2008/036708 A2 | 3/2008 | | |
| WO | 2013/027820 A1 | 2/2013 | | |

* cited by examiner

*Primary Examiner* — Angelo Trivisonno
(74) *Attorney, Agent, or Firm* — Husch Blackwell LLP

(57) ABSTRACT

An electronic device comprises a first encapsulating film in direct contact with a light-receiving and transmitting film and a second encapsulating film in direct contact with a back sheet. The first encapsulating film has a zero shear viscosity greater than that of the second encapsulating film. The back sheet of the electronic device contains fewer bumps than the back sheet of a comparable electronic device having a first encapsulating film with a zero shear viscosity less than or equal to that of the second encapsulating film.

7 Claims, No Drawings

ELECTRONIC DEVICES COMPRISING TWO ENCAPSULANT FILMS

FIELD OF THE INVENTION

This invention relates to encapsulation films and electrical devices containing encapsulation films. In one aspect the invention relates to encapsulation films which provide electrical insulation and environmental protection for active solar cells while in another aspect, the invention relates to an electric device having at least two encapsulant layers having a difference in viscosity.

BACKGROUND OF THE INVENTION

Encapsulation films offer insulation and environmental protection for electrical components used in electronic devices, such as solar cells used in PV modules. Encapsulants can act as a skin for electronic devices or completely enclose the device.

In the construction of a typical silicon-based photovoltaic (PV) module, there is a front glass layer followed by a front encapsulant, the solar cells, a back encapsulant and, finally, a back sheet. These layers are laminated at elevated temperatures to create the solar module.

The polymer material currently used in the back sheet of a solar module tends to shrink when exposed to the high temperatures necessary to properly laminate the solar module layers. Shrinkage of the back sheet is transferred forward to the other layers of the solar module, causing the individual PV cells within the solar module to be pulled closer together and the ribbons connecting the individual cells to crimp, or bend back against the back sheet.

The back sheet is therefore displaced during lamination. After lamination, visible bumps are present in the back of the solar module, decreasing the module's overall aesthetic appeal. The solar module may also not work properly due to the PV cells' movement and ribbon-crimping experienced during lamination.

Of interest are encapsulant films which prevent the transfer of movement as a result of shrinking from the back sheet of a solar module to the rest of the unit.

SUMMARY OF THE INVENTION

In one embodiment the invention is an electronic device comprising a first encapsulating film in direct contact with a light-receiving and transmitting film and a second encapsulating film in direct contact with a back sheet. The first encapsulating film has a zero shear viscosity greater than that of the second encapsulating film. The back sheet of the electronic device contains fewer bumps than the back sheet of a comparable electronic device having a first encapsulating film with a zero shear viscosity less than or equal to that of the second encapsulating film.

In another embodiment the invention is an electronic device comprising, in order, (i) a light-receiving and transmitting film, (ii) a first encapsulating film, (iii) at least one photovoltaic cell, (iv) a second encapsulating film, and (v) a back sheet. The first encapsulating film is in direct contact with the light-receiving and transmitting film, the second encapsulating film is in direct contact with the back sheet, and the at least one photovoltaic cell is in direct contact with the first and second encapsulating films. The first encapsulating film has a zero shear viscosity greater than that of the second encapsulating film.

In another embodiment the invention is a method for reducing bumps in an electronic device comprising selecting a first encapsulant film having a first zero shear viscosity and selecting a second encapsulant film having a second zero shear viscosity such that the first zero shear viscosity is within 700 to 10,000 Pa·s of the second zero shear viscosity.

DETAILED DESCRIPTION OF THE PREFERRED EMBODIMENT

Definitions

Unless stated to the contrary, implicit from the context, or customary in the art, all parts and percents are based on weight. For purposes of United States patent practice, the contents of any referenced patent, patent application or publication are incorporated by reference in their entirety (or its equivalent US version is so incorporated by reference) especially with respect to the disclosure of definitions (to the extent not inconsistent with any definitions specifically provided in this disclosure) and general knowledge in the art.

The numerical ranges in this disclosure are approximate, and thus may include values outside of the range unless otherwise indicated. Numerical ranges include all values from and including the lower and the upper values, in increments of one unit, provided that there is a separation of at least two units between any lower value and any higher value. As an example, if a compositional, physical or other property, such as, for example, molecular weight, etc., is from 100 to 1,000, then all individual values, such as 100, 101, 102, etc., and sub ranges, such as 100 to 144, 155 to 170, 197 to 200, etc., are expressly enumerated. For ranges containing values which are less than one or containing fractional numbers greater than one (e.g., 1.1, 1.5, etc.), one unit is considered to be 0.0001, 0.001, 0.01 or 0.1, as appropriate. For ranges containing single digit numbers less than ten (e.g., 1 to 5), one unit is typically considered to be 0.1. These are only examples of what is specifically intended, and all possible combinations of numerical values between the lowest value and the highest value enumerated, are to be considered to be expressly stated in this disclosure. Numerical ranges are provided within this disclosure for, among other things, the melt index and viscosity of compositions.

The terms "blend," "polymer blend" and like terms mean a composition of two or more polymers. Such a blend may or may not be miscible. Such a blend may or may not be phase separated. Such a blend may or may not contain one or more domain configurations, as determined from transmission electron spectroscopy, light scattering, x-ray scattering, and any other method known in the art.

The term "bump" as used herein refers a discernible displacement of the back sheet of a photovoltaic module following lamination. Bumps are typically the result of movement transferred from the back sheet as it shrinks during lamination through the rear encapsulant layer and to the individual solar cells. The solar cells move closer together, causing the connector ribbons to crimp and push outward against the back sheet. As a result, bumps will remain in the back sheet after lamination. Bumps may be visibly discernible with the human eye, either with or without aid (e.g., microscopy), or detected using instrumentation (e.g., measuring devices).

The term "comparable electronic device" refers to an electronic device comprising essentially the same composition as the electronic device to which it is being compared, except that at least one of the first or second encapsulating films has a zero shear viscosity different than that of the electronic device to which it is being compared.

The terms "composition", "formulation" and like terms mean a mixture or blend of two or more components. In the context of a mix or blend of materials from which an article of manufacture is fabricated, the composition includes all the components of the mix, e.g., polymers, catalysts, and any other additives or agents such as cure catalysts, antioxidants, flame retardants, etc.

The terms "comprising", "including", "having" and like terms are not intended to exclude the presence of any additional component, step or procedure, whether or not the same is specifically disclosed. In order to avoid any doubt, all processes claimed through use of the term "comprising" may include one or more additional steps, pieces of equipment or component parts, and/or materials unless stated to the contrary. In contrast, the term, "consisting essentially of" excludes from the scope of any succeeding recitation any other component, step or procedure, excepting those that are not essential to operability. The term "consisting of" excludes any component, step or procedure not specifically delineated or listed. The term "or", unless stated otherwise, refers to the listed members individually as well as in any combination.

The term "direct contact" is a configuration whereby two components are in physical contact with each other with no intervening layer(s) and/or no intervening material(s) located between at least a portion of the two contacting components.

The term "glass" refers to a hard, brittle, transparent solid, such as that used for windows, bottles, or eyewear, including, but not limited to, pure silicon dioxide ($SiO_2$), soda-lime glass, borosilicate glass, sugar glass, isinglass (Muscovy-glass), or aluminum oxynitride.

The term "ethylene/alpha-olefin interpolymer" refers to an interpolymer that comprises a majority weight percent (i.e., over 50 mole percent) polymerized ethylene monomer (based on the total weight of polymerizable monomers) and at least one alpha-olefin.

The term "ethylene-based polymer" as used herein, refer to a polymer that comprises a majority weight percent (i.e., over 50 mole percent) polymerized ethylene monomer (based on the total weight of polymerizable monomers), and optionally may comprise at least one polymerized comonomer.

The term "interpolymer" means a polymer prepared by the polymerization of at least two different types of monomers. This generic term includes copolymers, usually employed to refer to polymers prepared from two different types of monomers, and polymers prepared from more than two different types of monomers, e.g., terpolymers, tetrapolymers, etc.

The term "polymer" means a polymeric compound prepared by polymerizing monomers, whether of the same or a different type. The generic term polymer thus embraces the term homopolymer, usually employed to refer to polymers prepared from only one type of monomer, and the term interpolymer as defined below.

The term "thermoplastic" refers to a material which is a linear or branched polymer which can be repeatedly softened and made flowable when heated and returned to a hard state when cooled to room temperature. Thermoplastics can be molded or extruded into articles of any predetermined shape when heated to the softened state.

Grafted Resin Composition

In one embodiment, a silane-grafted ethylene interpolymer is provided. Ethylene interpolymers are generally known and available. Suitable ethylene interpolymers for use in the film have a relatively low density and modulus and good optical and electrical insulating properties.

Preferably, the ethylene interpolymers are ethylene/alpha-olefin interpolymers. The alpha-olefin of the interpolymers is preferably a $C_{3-20}$ linear, branched or cyclic alpha-olefin. Some non-limiting examples of suitable $C_{3-20}$ alpha-olefins include propene, 1-butene, 4-methyl-1-pentene, 1-hexene, 1-octene, 1-decene, 1-dodecene, 1-tetradecene, 1-hexadecene, 1-octadecene, 3-cyclohexyl-1-propene (allyl cyclohexane), and vinyl cyclohexane.

In some embodiments, some cyclic olefins, such as norbornene and related olefins, may be used in place of some or all of the alpha-olefins listed above and are considered for purposes of the described ethylene/alpha-olefin interpolymers to be included in the definition of alpha-olefin. Similarly, styrene and related olefins (e.g., alpha-methylstyrene, etc.) are also considered alpha-olefins for purposes of the present grafted resin composition. However, acrylic and methacrylic acid and their respective ionomers, acrylates, methacrylates and vinyl acetate are not considered alpha-olefins as used herein.

Some non-limiting examples of ethylene/alpha-olefin interpolymers useful in the grafted resin composition include ethylene/propylene, ethylene/butene, ethylene/1-hexene, ethylene/1-octene, ethylene/styrene, ethylene/propylene/1-octene, ethylene/propylene/butene, ethylene/butene/1-octene, and ethylene/butene/styrene. Ethylene/alpha-olefin interpolymers may be random or block interpolymers.

Preferably, the ethylene interpolymers are ethylene/alpha-olefin interpolymers having an alpha-olefin content of at least about 1 mole percent (mole %), preferably at least about 4 mole %, more preferably at least about 5 mole %, and even more preferably at least about 10 mole %, based on the comonomers in the interpolymer. In most embodiments, the ethylene/alpha-olefin interpolymers have an alpha-olefin content of less than about 30 mole %, more preferably less than about 20 mole %, and even more preferably less than about 15 mole %.

Lower density ethylene interpolymers are preferred for use in the present grafted resin composition. Lower density ethylene interpolymers may be obtained by controlling the alpha-olefin content of the interpolymer. The alpha-olefin content can be measured by $^{13}C$ NMR spectroscopy. Generally, the greater the alpha-olefin content of the interpolymer, the lower the density and the crystallinity. Lower density and lower crystallinity results in more desirable physical and chemical properties for a film layer used in an electronic device or module.

Ethylene interpolymers suitable for use in the grafted resin composition typically have a density of less than or equal to about 0.905 g/cc, preferably less than about 0.90 g/cc, preferably less than 0.89 g/cc, more preferably less than about 0.885 g/cc, and even more preferably less than about 0.88 g/cc. The density of the ethylene interpolymers is generally greater than about 0.85 g/cc, and more preferably greater than about 0.86 g/cc. Density is measured according to ASTM-D 792-03, Method B, in isopropanol.

Preferably, ethylene interpolymers have a short chain branch distribution index (SCBDI) or composition distribution branch index (CDBI) greater than about 30, preferably greater than about 40, more preferably greater than about 50, even more preferably greater than about 80 and most preferably greater than about 90. As used herein, SCBDI and CDBI are defined as the weight percent (wt %) of the polymer molecules having comonomer content within 50% of the median total molar comonomer content.

Preferably the ethylene interpolymers have low crystallinity, low haze, and high transmission of visible and UV light. Low modulus ethylene interpolymers are flexible and particularly well adapted for use in the present films and electronic devices because they provide stability under stress and are less prone to crack upon stress or shrinkage.

Ethylene interpolymers used in the grafted resin composition have a 2% secant modulus of less than about 200 MPa, preferably less than about 150 MPa, more preferably less than about 120 MPa, and even more preferably less than about 100 MPa.

Ethylene interpolymers useful in the grafted resin composition typically have a melting point of less than about 110° C., preferably less than about 105° C., more preferably less than about 100° C., even more preferably less than about 95° C. and still more preferably less than about 90° C. Blends of ethylene interpolymers having different melting points may be used as well. Ethylene interpolymers or blends of ethylene interpolymers with low melting points often exhibit desirable flexibility and thermoplasticity properties useful in the fabrication of electronic devices and modules.

The glass transition temperature (Tg) of ethylene interpolymers used in the grafted resin composition is less than about −30° C., typically less than about −35° C., preferably less than about −40° C., more preferably less than about −45° C. and even more preferably less than about −50° C. Moreover, the ethylene interpolymers also have a melt index (MI) of less than about 100 g/10 min, preferably less than about 75 g/10 min, more preferably at least less than about 50 g/10 min, even more preferably less than about 35 g/10 min, and even more preferably less than 20 g/10 min as measured in accordance with ASTM D-0138 (190° C./2.16 kg). At a minimum, the MI of the interpolymers is about 1 g/10 min, preferably about 5 g/10 min, and even more preferably about 10 g/10 min.

In preferred embodiments, the ethylene interpolymer is a thermoplastic ethylene interpolymer.

Ethylene interpolymers useful in the present grafted resin composition are typically made with a constrained geometry catalyst, a metallocene catalyst, or a post-metallocene catalyst. Such single-site catalyst technology is generally known. Some non-limiting suitable catalysts used for preparing ethylene interpolymers of the present invention include bis-(biphenylphenol) ligands coordinated through oxygen atoms to a transition metal (Ti, Zr and Hf) such as, for example, using as the complex [2,2'''-[1,3-propanediyl-bis(oxy-kO)]bis[3'',5,5''-tris(1,1-dimethylethyl)-5'-methyl[1,1':3',1''-terphenyl]-2'-olato-kO]]dimethyl.

Specific examples of ethylene interpolymers used in the grafted resin composition include very low density polyethylene (VLDPE), homogeneously branched, linear ethylene/alpha-olefin interpolymers, and homogeneously branched, substantially linear ethylene/alpha-olefin polymers (e.g., plastomers and elastomers) prepared using the preferred catalyst/cocatalyst systems described above. Most preferably, the ethylene interpolymers are homogeneously branched linear and substantially linear ethylene interpolymers.

Blends of any of the ethylene interpolymers described above may also be used, and the ethylene interpolymers may be blended or diluted with one or more other polymers to the extent that the polymers are (i) miscible with one another, (ii) the other polymers have little, if any, impact on the desirable properties of the ethylene interpolymer (i.e., optics and low modulus), and (iii) the ethylene interpolymers constitute at least 70 wt %, preferably at least about 75 wt % and more preferably at least about 80 wt % of the blend.

When a blend of two or more ethylene interpolymers is used, the overall MI is preferably less than about 100 g/10 min, preferably less than about 75 g/10 min, more preferably at least about 50 g/10 min, even more preferably less than about 35 g/10 min, and even more preferably less than 20 g/10 min as measured in accordance with ASTM D-0138 (190° C./2.16 kg). At a minimum, the MI of the interpolymers is about 1 g/10 min, preferably about 5 g/10 min, and even more preferably about 10 g/10 min.

Preferably, the ethylene interpolymers or ethylene interpolymers used will have a zero shear viscosity from about 200 to about 20,000 Pa·s.

To improve the adhesion of the ethylene interpolymers when incorporated into an electronic device or module, silane functionality is introduced to the interpolymers. The interpolymers also preferably benefit from being crosslinked at the time of contact or after, usually shortly after, the device or module has been constructed. Crosslinking enhances the thermal creep resistance of the interpolymer and durability of the module by increasing heat, impact and solvent resistance.

Silane functionality is introduced to the ethylene interpolymers by grafting or otherwise bonding an alkoxysilane to the ethylene interpolymer. Preferably, an alkoxysilane group having the following general formula (I) is grafted to the ethylene interpolymer:

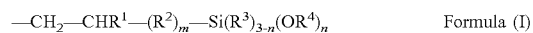

$$—CH_2—CHR^1—(R^2)_m—Si(R^3)_{3-n}(OR^4)_n \qquad \text{Formula (I)}$$

wherein $R^1$ is H or CH; $R^2$ and $R^3$ are, independently, an alkyl, aryl or hydrocarbyl containing from 1 to 20 carbon atoms and may also include other functional groups, such as esters, amides, and ethers; m is 0 or 1; $R^4$ is an alkyl or carboxyalkyl containing from 1 to 6 carbon atoms (preferably methyl or ethyl); and n is 1, 2 or preferably 3.

Preferred alkoxysilane compounds suitable for grafting include unsaturated alkoxysilanes where (1) the ethylenically unsaturated hydrocarbyl groups in formula (I) can be a vinyl, allyl, isopropenyl, butenyl, cyclohexenyl, or (meth)acryloxyalkyl (refers to acryloxyalkyl and/or methacryloxyalkyl) group, (2) the hydrolysable group ($OR^4$) can be a hydrocarbyloxy, hydrocarbonyloxy, or hydrocarbylamino group such as methoxy, ethoxy, propoxy, butoxy, formyloxy, acetoxy, propionyloxy and alkyl- or arylamino groups, and (3) the saturated hydrocarbyl group ($R^3$) can be methyl or ethyl. Some non-limiting examples of preferred alkoxysilanes include vinyltrimethoxysilane (VTMOS), vinyltriethoxysilane (VTEOS), allyltrimethoxysilane, allyltriethoxysilane, 3-acryloylpropyltrimethoxysilane, 3-acryloylpropyltriethoxysilane, 3-methacryloylpropyltrimethoxysilane, and 3-methacryloylpropyltriethoxysilane and mixtures of these silanes.

Typically there is at least 0.1 wt % alkoxysilane in the grafted interpolymer, preferably at least about 0.5 wt %, more preferably at least about 0.75 wt %, even more preferably at least about 1 wt % and more preferably at least about 1.2 wt %. The grafted interpolymer usually contains less than 10 wt %, preferably less than or equal to about 5 wt %, and more preferably less than or equal to 2 wt % alkoxysilane.

Grafted techniques and process are well known in the art and include using free radical graft initiators such as, for example, peroxides and azo compounds, or ionizing radiation. Organic free radical graft initiators are preferred, such as dicumyl peroxide, di-tert-butyl peroxide, t-butyl perbenzoate, benzoyl peroxide, cumene hydroperoxide, t-butyl peroctoate, methyl ethyl ketone peroxide, 2,5-dimethly-2,5-di(t-butyl peroxy)hexane, lauryl peroxide, and tertObutyl peracetate. A suitable azo compound is azobisisobutyl nitrile.

While any of the grafting processes known in the art may be used, one non-limiting example of a grafting process includes blending the alkoxysilane and ethylene interpolymer with a graft initiator in the first stage of a reactor extruder, such as a Buss kneader. Grafting conditions may vary, but the melt temperatures are typically between 160° C. and 260° C., and preferably between 190° C. and 230° C., depending on the residence time and half-life of the initiator.

If crosslinking is desired, the grafted resin composition will preferably have a gel content of at least 30%, more preferably at least 40%, even more preferably at least 50% and most preferably at least 60%, as measured in accordance with ASTM D-2765.

Crosslinking methods and processes are well known in the art, and any suitable method may be used to crosslinking the silane-grafted ethylene interpolymers used in the grafted resin composition. A non-limiting crosslinking method includes moisture (water) curing using a hydrolysis/condensation catalyst. Such catalysts include, for example, Lewis acids such as dibutyltin dilaurate, dioctyltin dilaurate, stannous octonoate, and hydrogen sulfonates such as sulfonic acid. UV light or sunlight may also be used to promote crosslinking, preferably using one or more photoinitiators. Non-limiting examples of photoinitiators include organic carbonyl compounds such as benzophenone, benzanthrone, benzoin and alkyl ethers thereof, 2,2-diethoxyacetophenone, 2,2-dimethoxy, 2 phenylacetophenone, p-phenoxy dichloro-acetophenone, 2-hydroxycyclohexylphenone, 2-hydroxy-isopropylphenone, and 1-phenylpropanedione-2-(ethoxy carboxyl)oxime. Initiators may be used in accepted known quantities, typically at least about 0.05 wt % based on the weight of the interpolymer, more typically at least 0.1 wt % and even more typically about 0.5 wt %.

Free radical crosslinking cocatalysts may also be used, including multifunctional vinyl monomers and polymers, triallyl cyanurate and trimethylolpropane trimethacrylate, divinyl benzene, acrylates and methactrylates of polyols, allyl alcohol derivatives, and low molecular weight polybutadiene. Sulfur crosslinking coagents include benzothaizyl disulfide, 2-mercaptobenzothiazole, copper dimethyldithio-carbamate, dipentamethylene thiuram tetrasulfide, tetrabutylthiuram disulfide, tetramethylthiuram disulfide and tetramethylthiuram monosulfi de. These coagents may be used in accepted and known quantities, typically at least about 0.05 wt % based on the weight of the interpolymer, more typically at least about 0.1 wt %, and most preferably at least about 0.5 wt %. Typically, the maximum amount of cocatalyst used is less than 10 wt %, preferably less than about 5 wt %, and most preferably less than about 3 wt %.

One difficulty in using thermally activated free radical initiators to promote crosslinking is that they may initiate premature crosslinking. Premature crosslinking results from thermal decomposition of the free radical initiator, which results in scorch. Methods of minimizing scorch are known in the art and include introducing scorch inhibitors into the grafted resin composition. Non-limiting examples of scorch inhibitors include organic hydroperoxides, N-nitroso diphenylamine, N,N'-dinitroso-para-phenylamine, isoamyl nitrite, tert-decyl nitrite, monomeric vinyl compounds, aromatic amines, phenolic compounds, mercaptothiazole compounds, bis(N,N-disbustituted-thiocarbamoyl) sulfides, hydroquinones, dialkyldithiocarbamate compounds, mixtures of metal salts of disubstituted dithiocarbamic acid, 4-hydroxy-2,2,6, 6-tetramethylpiperidin-1-oxyl.

Scorch inhibitors may be used in known amounts, typically at a minimum of at least about 0.01 wt %, preferably at least about 0.05 wt %, more preferably at least about 0.1 wt % and most preferably at least about 0.15 wt % based on the weight of an interpolymer having 1.7 wt % peroxide. Typically the maximum amount of scorch inhibitor used does not exceed 2 wt %, preferably does not exceed about 1.5 wt %, and more preferably does not exceed about 1 wt % of an interpolymer having 1.7 wt % peroxide.

Other additives may be included with the silane-grafted ethylene interpolymer. Other additives include UV absorbers, UV stabilizers, processing stabilizers, antioxidants, anti-blocks, anti-slips, pigments and fillers known in the art. Additives are used in the manner and amount as commonly known in the art.

Encapsulation Film

In one embodiment, a film or a film layer comprising a blend of (A) a silane-containing ethylene interpolymer and (B) at least one ethylene/alpha-olefin interpolymer is provided. As used herein, a film may be a monolayer or multilayer film. The terms "layer" and "film layer" refer to an individual layer or layers of an overall thicker article (the film). The term "film" as used herein, including when used in the phrase "film layer" and when used to refer to an individual layer or layers, and unless expressly having a specified thickness, includes any relatively thin, flat extruded or cast thermoplastic article having a generally consistent and uniform thickness as needed for use in electronic devices.

Preferably, the film described herein has a thickness of up to about 25 mils (0.64 mm) and more preferably less than about 20 mils (0.51 mm). Film layers may be very thin, and may be as thin as 10 nm when used in a microlayer film. Generally, film layers of the present film have a thickness of at least about 1 mil (25 µm), preferably at least about 2 mils (51 µm), and more preferably at least about 3 mils (75 µm).

The silane-containing ethylene interpolymer is as set forth in any of the embodiments above. The at least one ethylene/alpha-olefin interpolymer may be any of the ethylene/alpha-olefin interpolymers described and suitable for use in the silane-containing ethylene interpolymer but without the silane functionality. In some embodiments, (A) and (B) may be a blend of two or more silane-containing ethylene interpolymers or ethylene/alpha-olefin interpolymers, respectively.

The composition comprising (A) a silane-containing ethylene interpolymer and (B) at least one ethylene/alpha-olefin interpolymer can contain from 1 wt % to 100 wt % (A). In preferred embodiments, the composition contains from 5 wt % to 100 wt % (A) and from 0 wt % to 80 wt % (B). In still further embodiments, the composition comprising (A) a silane-containing ethylene interpolymer and (B) at least one ethylene/alpha-olefin interpolymer may also contain additives, such as UV stabilizers, antioxidants and other compounds known in the art. These additives may be provided in known quantities, and, in some embodiments, may be added in the form of a masterbatch, that is pre-blended in an amount of polymer composition.

The composition comprising (A) a silane-containing ethylene interpolymer and (B) at least one ethylene/alpha-olefin interpolymer may be fabricated into a monolayer film or at least one film layer, preferably as a surface layer, of a multilayer film. The general methods for the preparation of films are generally known in the art and the equipment is generally commercially available. Such films may be prepared by, for example, cast, blown, calendared, or extrusion coating processes; and composite or laminate structures made with any of the foregoing articles.

Preferably, the composition comprising (A) a silane-containing ethylene interpolymer and (B) at least one ethylene/alpha-olefin interpolymer may be formed into an encapsulant layer for use as a layer in a laminated structure, such as a PV module.

Electronic Devices

Films comprising the grafted resin composition such as those described in any above embodiment may be included in a laminated structure. The grafted resin composition may be provided as a monolayer film or as a multilayer film with at least one additional layer, such as glass or a surface of an electronic device.

Films of many types of materials can be employed in laminate structures with the grafted resin composition. In addition to glass, other films, including cover films, protective films, and top and/or back films may be included in a laminated structure. Non-limiting examples of materials for such films include polycarbonate, acrylic polymers, polyacrylate, cyclic polyolefins such as ethylene norbornene, metallocene-catalyzed polystyrene, polyethylene terephthalate, polyethylene naphthalate, fluoropolymers such as ethylene-tetrafluoroethylene (ETFE), polyvinyl fluoride (PVF), fluoroethylene-propylene (FEP), ethylene-chlorotrifluoroethylene (ECTFE), and polyvinylidene fluoride (PVDF).

Various methods are known in the art for making laminated structure. Generally, a laminated structure of any of the above embodiments is made by (1) positioning the film (e.g., a monolayer of the grafted resin composition or a multilayered film including the grafted resin composition) and at least one other film (e.g., glass) such that a facial surface of the film containing the silane-containing interpolymer is indirect contact with a facial surface of the other film, (2) laminating and adhering the first and second films at a lamination temperature, and, optionally, (3) crosslinking the silane-containing interpolymer. In some embodiments, crosslinking and laminating and adhering the layers may occur in the reverse order or simultaneously.

The films of a laminated structure may be applied to each other in any suitable manner known in the art, including, but not limited to, vacuum lamination, extrusion, calendaring, solution casting and injection molding.

Preferably, the films of the embodiments described above can be used to create a laminated structure which is an electronic device or module. More preferably, the films of the embodiments described above can be used as skin films or encapsulant films to construct electronic device modules (e.g., photovoltaic or solar cells) in the same manner and using the same amounts as the skin or encapsulant materials known in the art.

In a preferred aspect of the invention, laminated PV structures comprise, in sequence, starting from the "top film" which the light initially contacts: (i) a light-receiving and transmitting top sheet or cover sheet film, usually comprising glass, (ii) a front encapsulating film, (iii) photovoltaic cells, (iv) a rear encapsulating film, and (v) a back sheet film, usually comprising glass or other polymer film structure back layer substrate. The number of photovoltaic cells in a given electronic device will vary depending on the nature and use of the device.

A back sheet used in laminated PV structures is a multilayered structure which protects the back surface of a PV structure. Generally, back sheets may a core polyethylene terephthalate (PET) layer or other material layer which is shrinks during lamination.

Both the front encapsulating film and the rear encapsulating film may be films as described herein. Preferably, a single encapsulating film, most preferably the rear encapsulating film, is a film as described in any of the above embodiments comprising the grafted resin composition.

The films (i)-(v) of a laminated PV structure described above are bonded through lamination. Through lamination, the top sheet is brought into direct contact with the front encapsulating film, and the back sheet is brought into direct contact with the rear encapsulating film. The photovoltaic cells are secured between, and in direct contact with, the front and rear encapsulating films. As a result, portions of the front and rear encapsulating films are in direct contact with each other.

Lamination processes used to create electronic devices, and specifically the preferred laminated PV structure, require a step with heating and compressing at conditions sufficient to create the needed adhesion between the films. In general, lamination temperatures will depend on the specific polymer content of the layers. At the lower end, lamination temperatures need to be at least about 120° C., preferably at least about 130° C. and, at the upper end, less than or equal to about 180° C., preferably less than or equal to about 170° C.

The elevated temperatures required for lamination cause some polymer materials, such as the encapsulating films and back sheet of the PV structure, to shrink, resulting in movement of the films relative to each other during lamination. Usually, the back sheet is the film having a propensity to shrink, resulting in movement of the rear encapsulating film and subsequent films. That movement causes the PV cells to move closer to each other during lamination and the ribbons connecting the cells to buckle or fold back on themselves. The ribbons push back out against the rear encapsulating film and back sheet, causing bumps in the back sheet.

It was surprisingly discovered that using encapsulating films having different zero shear viscosity values, and specifically having a front (in contact with the light-receiving and transmitting film) encapsulating film with a zero shear viscosity greater than that of a rear (in contact with the back sheet) encapsulating film, prevents the transfer of movement caused by the shrinking back sheet throughout the rest of an electronic device. As a result, an electronic device having encapsulating films with this difference in zero shear viscosities show fewer bumps in the back sheet compared to the back sheet of a comparable electronic device having encapsulating films with equal zero shear viscosities or a front encapsulating film with a zero shear viscosity less than that of the rear encapsulating layer.

Preferably, the zero shear viscosity of the front encapsulating film, which is in direct contact with the light-receiving/transmitting film, is greater than that of the second encapsulating film, which is in direct contact with the back sheet. More preferably, the zero shear viscosity of the front encapsulating film is 700-10,000 Pa·s, more preferably 1,000-8,000 Pa·s, and most preferably 2,000-6,000 Pa·s.

In preferred embodiments, the rear encapsulating film is a film as described in any above embodiments, having a zero shear viscosity of 200-2,000 Pa·s, more preferably 400-900 Pa·s, even more preferably 500-900 Pa·s and most preferably 600-800 Pa·s. In other embodiments, the rear encapsulating film may be any material suitable for use as an encapsulant and having a viscosity less than the front encapsulating film.

The zero shear viscosity of the front and rear encapsulating films should be at least 100 Pa·s apart. As the difference between the zero shear viscosity of the front encapsulating film and the rear encapsulating film become less than 100 Pa·s, the beneficial bump-reducing effect is reduced. While the difference in zero shear viscosity between the front and rear encapsulating films may be up to 10,000 Pa·s, there is little additional benefit beyond a difference of 5,000 Pa·s.

Not to be bound by any particular theory, it is thought that as the PET core layer or other high-shrinkage layer of the back sheet shrinks, the rear encapsulating film does not resist the movement of the back sheet. It remains bonded to the solar cells as well, but, because there is less integrity to the film (i.e., lower shear viscosity), the film does not cause the cells to move. In other words, when the back sheet shrinks, the rear encapsulating film is better able to disperse the shear stress caused by the back sheet before it reaches the cells or the front encapsulating film. In effect, it is hypothesized that the rear encapsulating film of the present invention acts as an internal stress reducer. This is in contrast to a standard, crosslinked EVA rear encapsulating film which would lock in the stress caused by the shrinking back sheet.

In another embodiment, a method of reducing bumps in an electronic device is provided. The method includes selecting a first encapsulant film have a first zero shear viscosity and selecting a second encapsulant film having a second zero shear viscosity such that the first zero shear viscosity is within 700 to 10,000 Pa·s of the second zero shear viscosity. These two encapsulant films are then used in forming a laminated structure by (1) bringing a light-receiving and transmitting top sheet in direct contact with the first encapsulant film, (2) bringing a back sheet in direct contact with the second encapsulant film, (3) securing at least one photovoltaic cell between and in direct contact with the first and second encapsulant films such that portions of the first and second encapsulant films are in direct contact with each other, and (4) laminating and adhering the light-receiving and transmitting top sheet, first encapsulant film, second encapsulant film and back sheet at a lamination temperature. The silane-containing interpolymers of the encapsulant films may also be crosslinked.

The following examples are illustrative of certain embodiments of the present invention. All parts and percentages are based on weight except as otherwise indicated.

Specific Embodiments

Materials

Luperox 101 peroxide: 2,5-bis(tert-butylperoxy)-2,5-dimethylhexane, provided by Arkema Inc.

E/O 1: "E/O 1" is an ethylene/octene interpolymer having a density of 0.870 g/cc and an MI of 5 g/10 min.

E/O 2: "E/O 2" is an ethylene/octene interpolymer having a density of 0.902 g/cc and an MI of 30 g/10 min.

E/O 3: "E/O 3" is an ethylene/octene interpolymer having a density of 0.902 g/cc and an MI of 3 g/10 min.

E/O 4: "E/O 4" is an ethylene/octene interpolymer having a density of 0.885 g/cc and an MI of 18 g/10 min.

Masterbatch: "Masterbatch" is a masterbatch with additives made with an ethylene/octene copolymer having a density of 0.870 g/cc and an MI of 5 g/10 min carrier resin.

Protekt HD (Madico): Protekt HD is a backsheet comprising the structure fluoropolymer/polyethylene terephthalate/ethylene-vinyl acetate (fluoropolymer/PET/EVA).

Dunmore-1360 PPE+: Dunmore-1360 PPE+ is a backsheet comprising the structure PET/PET/EVA.

Saiwu Cybrid KPE: Saiwu Cybrid KPE is a backsheet comprising the structure fluoropolymer/PET/EVA.

Dunmore 1100 PPE+SW: Dunmore 1100 PPE+SW is a backsheet comprising the structure PET/PET/EVA.

Dunmore 1360 PPE+Ultra Clear: Dunmore 1360 PPE+Ultra Clear is a back sheet comprising the structure PET/PET/EVA.

Krempel Akasol PTL 2-38/250 TPE: Krempel Akasol PTL 2-38/250 TPE is a backsheet comprising the structure Tedlar/PET/EVA.

Testing Methodology

Glass Adhesion: The glass adhesion of the films described herein was determined by laminating a structure of glass with a $1^{st}$ encapsulant film, a $2^{nd}$ encapsulant film and TPE back sheet at 150° C. on a vacuum laminator for 3 minutes of vacuum followed by 7 minutes of pressure at one atmosphere. Two pieces of encapsulant were used to simulate the structure of a solar module. The laminated glass structure was then tested by 180° peel in an Instron at 2 inches per minute. The average value of the region between 1 inch and 2 inches was reported.

Optical Transmission: A monolayer of film as described herein was subjected to a lamination cycle on a vacuum laminator at 150° C. for 3 minutes of vacuum followed by 7 minutes of pressure at one atmosphere. The optical transmission of the film was measured using a Perkin Elmer Lambda 35 spectrophotometer in accordance with ASTM D1003, method B.

Haze: A monolayer of film was laminated between two layers of glass to mimic the single layer of film present between the glass and the cells of a solar module (the most dominant visual aesthetic component of a solar module). The yellowness index was measured before and after damp heat testing at 85° C. and 85% relative humidity using ASTM E313.

Tensile Strain: Tensile stress is determined according to ASTM D882-12.

Tensile Stress: Tensile stress is determined according to ASTM D882-12.

Toughness: Toughness is determined according to ASTM D882-12 and is the area under the stress-strain curve.

Modulus: The modulus is determined by calculating the slope of the initial linear region of the tensile stress curve according to ASTM D882-12.

Encapsulating Film Preparation

The saline-grafted resin was compounded using a twin screw reactive extrusion process. The grafted resin was cut into pellets and stored in a foil bag. Separately, a master batch with thermal and UV stabilizers was compounded using an FCM extruder. Film samples with 457 μm thickness were prepared on a 3-layer cast co-extrusion line. The three extruders were all 25 mm in diameter with Maddock mixing sections and the screw end. The casting roll was always contacting the B extruder and the C extruder was always the core. Die width was 300 mm.

Table 1 shows the film formulations used in examples 1-2 and comparative example 1. The formulations were purged in for 15 minutes representing 7.5 residence time in the extruders at 80 RPM.

TABLE 1

Film Formulations in Percent Based on Total Weight (wt %)

|  | Example 1 | Example 2 | Comparative Example 1 |
|---|---|---|---|
| Grafted Resin Composition | | | |
| Vinyl trimethoxy silane | 1.905 | 1.905 | 1.905 |
| Luperox 101 peroxide | 0.095 | 0.095 | 0.095 |
| E/O 1 | 44.1 | 16.6 | 83.3 |
| E/O 2 | 39.2 | 21.1 | |
| E/O 3 | | | 14.7 |
| E/O 4 | 14.7 | 60.3 | |
| Final Film Composition | | | |
| Grafted resin composition (above) | 65.0 | 65.0 | 65.0 |
| E/O 1 | | | 25.0 |
| E/O 4 | 25.0 | 25.0 | |
| Masterbatch | 10.0 | 10.0 | 10.0 |

PV Module Preparation 156 mm by 156 mm PV cells, such as those available from Ever Bright Solar, were used to create the PV modules for examples 1-2 and comparative example 1. 9-cell monocrystalline strings were created, with the PV cells positioned 3 mm apart and connected by 76.2 mm lengths of buss ribbon, such as tin coated copper buss ribbon. In further embodiments, multi-crystalline cells may be used as well. Front encapsulant films, rear encapsulant films and back sheets were cut to size in the machine direction of the film. For the 9-cell strings used, the encapsulating films and back sheets were cut to 215.9 mm by 1524 mm. 3 mm glass, washed, squeegeed and toweled dry, was used for the top sheets.

The PV modules were assembled for lamination on a Teflon sheet in the following order: glass, front encapsulating film (embossed side to glass, approximately 25.4 mm from the bottom edge of the glass), PV cell string (face down and centered on front encapsulating layer), rear encapsulating film (embossed side to string), and back sheet. The assembled modules were covered with a Teflon sheet.

The assembly was pulled into a P-Energy L200A laminator. The lamination condition was 150° C. with a vacuum pump time of 3 minutes and a hold time of 7 minutes at 1000 mBar. The laminated structures were pulled from the laminator and cooled at room temperature for approximately 1 minute prior to removing the top Teflon sheet.

Results

The electrical, optical and adhesion properties of the formulations in Table 1 are provided in Table 2 below. As shown, the encapsulating films of Examples 1 and 2 have a significantly lower zero shear viscosity than Comparative Example 1 while retaining approximately the same transmission, haze and clarity. Examples 1 and 2 also exhibit excellent glass adhesion comparable to Comparative Example 1.

TABLE 2

Electrical, Optical and Adhesion Properties

| | Volume Resistivity (ohm-cm) | Transmission (%) | Haze (%) | Clarity (%) | Adhesion Glass (lb-f/in) | Zero Shear Viscosity (Pa*s) |
|---|---|---|---|---|---|---|
| Example 1 | $2 \times 10^{15}$ | 88.8 | 23.0 | 99.2 | 109.4 | 700 |
| Example 2 | $1.6 \times 10^{15}$ | 87.7 | 31.0 | 99.1 | 100.8 | 860 |
| Comparative 1 | $4.9 \times 10^{15}$ | 87.3 | 19.7 | 99.6 | 103.3 | 4065 |

The tensile strength of the formulations in Table 1 is provided in Table 3, below. Example 1 has a lower modulus than Comparative Example 1, indicating better elasticity. Example 1 also has a lower strain at break.

TABLE 3

Tensile Strength for 457 μm Thick Film (20 inches per minute, 2 inch gap)

| Films | Direction | Thickness (in) | Tensile Strain at Break (%) | Tensile Stress at Break (psi) | Toughness (psi) | Tensile Stress at Yield (MPa) | Modulus (MPa) |
|---|---|---|---|---|---|---|---|
| Example 1 | MD | 0.019 | 896 | 1500 | 6560 | 2.95 | 1.62 |
| | TD | 0.019 | 872 | 1480 | 6530 | 2.90 | 1.67 |
| Comparative 1 | MD | 0.019 | 946 | 1500 | 6540 | 2.42 | 1.93 |
| | TD | 0.019 | 918 | 1390 | 6070 | 2.44 | 1.80 |

Various back sheet and encapsulating film combinations were tested for the formation of bumps after lamination. Table 4 shows the back sheet and encapsulating film combinations tested. The number of bumps on the back sheet was determined by visual inspection.

Applicants surprisingly and unexpectedly discovered that using a rear encapsulating film having a shear viscosity less than the shear viscosity of the front encapsulating film greatly reduced the presence of bumps in the PV module back sheet. Applicants surprisingly discovered that a difference of at least 140 Pa·s or greater between the front and rear encapsulant films dramatically reduces bumps. Smaller differences also surprisingly show a reduction in bumps.

Not to be bound by any particular theory, Applicants believe that as the core layer (usually PET) of the back sheet shrinks, the rear encapsulating film does not resist the movement of the back sheet. It remains bonded to the solar cells as well, but, because there is less integrity to the film (i.e., lower shear viscosity), the film does not cause the cells to move. In other words, when the back sheet shrinks, the rear encapsulating film is better able to disperse the shear stress caused by the back sheet before it reaches the cells or the front encapsulating film. In effect, it is hypothesized that the rear encapsulating film of the present invention acts as an internal stress reducer. This is in contrast to a standard, crosslinked EVA rear encapsulating film which would lock in the stress caused by the shrinking back sheet.

As seen in Table 4, the number of bumps visible in the back sheet is significantly reduced, and in some cases eliminated, when the zero shear viscosity of the rear encapsulant film is less than that of front encapsulant film. The combination of Comparative Example 1 as the front encapsulant film and Example 1 as the rear encapsulant film showed improved results over the combination of Comparative Example 1 as the front encapsulant film and Example 2 as the rear encapsulant film. Applicants believe this result is attributable to the increased difference in viscosity between Comparative Example 1 and Example 1 (a zero shear viscosity difference of 3,365) as compared to that of Comparative Example 1 and Example 2 (a zero shear viscosity difference of 3,205).

TABLE 4

Encapsulant Film and Back Sheet Combinations and Bump Formation

| | Front Encapsulant Film | | |
| --- | --- | --- | --- |
| | C1 | C1 | C1 |
| | Rear Encapsulant Film | | |
| | C1 | E1 | E2 |
| Back Sheet | Number of Bumps | Number of Bumps | Number of Bumps |
| Coveme TS APYE | 6 | 0 | |
| Protekt HD (Madico) | 4 | 0 | 0 |
| Dunmore - 1360 PPE+ | 1 | 0 | |
| Saiwu Cybrid KPE | 5 | 0 | |
| Dunmore 1100 PPE+ SW | 4 | 0 | 2 |
| Dunmore 1360 PPE + Ultra Clear | 0 | 0 | 0 |
| Krempel Akasol PTL 2-38/250 TPE | 4 | 0 | 1 |
| Krempel Akalight | 2 | 0 | 4 |

As used in the above table, C1 is Comparative Example 1, E1 is Example 1 and E2 is Example 2.

Applicants also surprisingly discovered that the stress shrink of a given back sheet may also contribute a given encapsulant film combination's effectiveness in reducing bumps. As illustrated in Table 4, back sheets having higher stress shrink values tend to show more bumps, in general. The best bump reduction was achieved when the difference in zero shear viscosity between the rear encapsulant film and the front encapsulant film was greater.

It is specifically intended that the present invention not be limited to the embodiments and illustrations contained herein, but include modified forms of those embodiments including portions of the embodiments and combinations of elements of different embodiments as come within the scope of the following claims.

We claim:

1. An electronic device comprising:
    a first encapsulating film in direct contact with a light-receiving and transmitting film, the first encapsulating film comprising a blend of
        a silane-grafted ethylene/alpha-olefin random interpolymer comprising 0.5 wt % to 5 wt % alkoxysilane, based on the total weight of the silane-grafted ethylene/alpha-olefin random interpolymer, grafted to a first ethylene/alpha-olefin random interpolymer, and
        a second ethylene/alpha-olefin random interpolymer, and
    a second encapsulating film in direct contact with a back sheet, the second encapsulating film comprising a blend of
        a silane-grafted ethylene/alpha-olefin random interpolymer comprising from 0.5 wt % to 5 wt % alkoxysilane, based on the total weight of the silane-grafted ethylene/alpha-olefin random interpolymer, grafted to a third ethylene/alpha-olefin random interpolymer, and
        from 20 wt % to 40 wt % of a fourth ethylene/alpha-olefin random copolymer, based on the total weight of the second encapsulating film,
    wherein the first and second ethylene/alpha-olefin random interpolymers are the same and the third and fourth ethylene/alpha-olefin random interpolymers are the same,
    wherein each of the third and fourth ethylene/alpha-olefin random interpolymers has a melt index from 10 g/10 min to 20 g/10 min,
    wherein the second encapsulating film has a zero shear viscosity from 500 Pa·s to 900 Pa·s,
    wherein the first encapsulating film has a zero shear viscosity greater than the zero shear viscosity of the second encapsulating film, and
    wherein the zero shear viscosity of the first encapsulating film is within 700 Pa·s to 5000 Pa·s of the zero shear viscosity of the second encapsulating film.

2. The electronic device of claim 1 wherein the back sheet contains fewer bumps than an comparable electronic device, wherein the comparable electronic device is identical to the electronic device except that the first encapsulating film of the comparable electronic device has a zero shear viscosity less than or equal to that of second encapsulating film of the comparable electronic device.

3. The electronic device of claim 1 wherein the zero shear viscosity of the first encapsulating film is within 3,000 to 4,000 Pas of the shear viscosity of the second encapsulating film.

4. The electronic device of claim 1 wherein the second encapsulating film has a zero shear viscosity of 600 to 900 Pa a·s.

5. The electronic device of claim 1 wherein the silane-grafted ethylene/alpha-olefin interpolymer of the second encapsulating film comprises from 60 wt % to 70 wt % of the second encapsulating film based on total weight of the second encapsulating film.

6. The electronic device of claim 1 wherein the each of the first, second, third and fourth ethylene/alpha-olefin random interpolymers is an ethylene/octene polymer.

7. The electronic device of claim 1 wherein the ethylene/alpha-olefin interpolymer of the second encapsulating film comprises from 30 wt % to 40 wt % of the second encapsulating film based on total weight of the second encapsulating film.

* * * * *